United States Patent
Yasui (10) Patent No.: US 7,644,479 B2
(45) Date of Patent: Jan. 12, 2010

(54) METHOD OF PRODUCING A PIEZOELECTRIC ACTUATOR

(75) Inventor: Motohiro Yasui, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 525 days.

(21) Appl. No.: 11/357,437

(22) Filed: Feb. 21, 2006

(65) Prior Publication Data

US 2006/0279170 A1 Dec. 14, 2006

(30) Foreign Application Priority Data

Feb. 21, 2005 (JP) .............................. 2005-044386

(51) Int. Cl.
*H01L 41/22* (2006.01)
*H01L 41/00* (2006.01)

(52) U.S. Cl. .................... 29/25.35; 29/25.41; 29/25.42; 29/890.1; 29/830; 29/846; 310/311

(58) Field of Classification Search ................. 29/25.35, 29/890.1, 25.41, 25.42, 825–830, 846–847; 310/311, 358, 328, 330; 347/68–70; 333/193, 333/195

See application file for complete search history.

(56) References Cited

U.S. PATENT DOCUMENTS

| | | | | |
|---|---|---|---|---|
| 5,933,167 A | * | 8/1999 | Shimada et al. | ............. 347/70 |
| 6,097,133 A | * | 8/2000 | Shimada et al. | ............ 310/358 |
| 6,103,400 A | | 8/2000 | Yamada et al. | |
| 6,387,225 B1 | * | 5/2002 | Shimada et al. | ........ 204/192.18 |
| 6,469,421 B1 | | 10/2002 | Wakabayashi et al. | |

FOREIGN PATENT DOCUMENTS

| | | |
|---|---|---|
| EP | 1321294 | 6/2003 |
| GB | 1465152 | 2/1997 |
| JP | H6291387 | 10/1994 |
| JP | 11204849 | 7/1999 |
| JP | 200015809 | 1/2000 |
| JP | 200154946 | 2/2001 |
| JP | 200243644 | 2/2002 |

OTHER PUBLICATIONS

European Search Report for European Patent Appl'n. No. 06 00 3444, mailed Jul. 13, 2006.

* cited by examiner

*Primary Examiner*—Minh Trinh
*Assistant Examiner*—Tai Nguyen
(74) *Attorney, Agent, or Firm*—Baker Botts L.L.P.

(57) ABSTRACT

A lower electrode 3 including a low-temperature melting layer 3A and a high-temperature melting layer 3B having mutually different melting-start temperatures is provided between a vibration plate 2 and a piezoelectric layer 4. In a calcination step of calcinating the lower electrode 3, the calcination is performed at a low temperature at which only the low-temperature melting layer 3A melts, and in an annealing-process step of the piezoelectric layer 4, the annealing process is performed at a high temperature at which the high-temperature melting layer 3B melts. At this time, in the calcination step, the melting of platinum nano-particles occurs in the low-temperature melting layer 3A, rendering the adhesion and diffusion-preventive effect. Further, in the annealing step, in the high-temperature melting layer 3B, platinum particles are melted, rendering the adhesion and diffusion-preventive effect. The degradation of piezoelectric characteristics of the piezoelectric actuator can be suppressed by the annealing process.

10 Claims, 7 Drawing Sheets

METHOD OF PRODUCING A PIEZOELECTRIC ACTUATOR

BACKGROUND OF THE INVENTION

1. Field of the Invention

The present invention relates to a piezoelectric actuator and a method of producing the piezoelectric actuator. The present invention, more specifically, relates to a piezoelectric actuator which has satisfactory piezoelectric characteristics, a method of producing such piezoelectric actuator, and a method of producing an ink-jet head.

2. Description of the Related Art

An example of a piezoelectric actuator used in ink-jet head or the like is described in Japanese Patent Application Laid-open Publication No. 2001-54946. In this piezoelectric actuator, a substrate (a vibration plate) is provided such that an opening of a pressure chamber which communicates with a nozzle opening in a channel forming body, and a lower electrode, a piezoelectric layer, and an upper electrode are laminated on this substrate. When an electric field is applied between the upper electrode and the lower electrode, the substrate is bent with the deformation of the piezoelectric layer. Due to this, ink in the pressure chamber is pressurized and is discharged from the nozzle opening.

Such a piezoelectric actuator is manufactured, for example, as described below. First of all, a metal paste such as Pt paste is coated on the substrate, and calcinated to form a lower electrode. Next, a piezoelectric layer is formed on this lower electrode by an aerosol deposition method (AD method). In the aerosol deposition method, a substance in which fine particles of a piezoelectric material such as lead zirconate titanate (PZT) are dispersed in a gas is jetted toward a surface of the substrate, and the fine particles are allowed to be collided and to be deposited on the substrate. Thus, the piezoelectric layer is formed.

SUMMARY OF THE INVENTION

Here, in the AD method, since the particles of the piezoelectric material ejected are adhered on the substrate while being collided and pulverized, the size reduction of the particles and the lattice defect are caused due to the collision, and in some cases piezoelectric characteristics of a piezoelectric film which is formed cannot be ensured sufficiently. Therefore, after the formation of the piezoelectric layer, it is necessary to recover the piezoelectric characteristics by performing an annealing process on this piezoelectric layer.

However, when the annealing process is performed at a high temperature to achieve high piezoelectric characteristics, an element contained in the substrate is diffused in the piezoelectric film in some cases, thereby degrading the piezoelectric characteristics. Moreover, due to a difference in a coefficient of thermal expansion of materials forming the layers respectively, a stress is generated in an interface of overlapping layers, and there is an exfoliation of the layers. Therefore, sufficient piezoelectric characteristics cannot be achieved.

The present invention is made in view of a situation described above, and an object of the present invention is to provide a piezoelectric actuator which is capable of suppressing the degradation of piezoelectric characteristics caused by annealing process, and a method of producing the piezoelectric actuator and a method of producing an ink-jet head.

The inventor of the present invention reached the following knowledge through his diligent research for developing the piezoelectric actuator capable of suppressing the degradation of the piezoelectric characteristics caused by the annealing process, the method of producing the piezoelectric actuator, and the method of producing the ink-jet head.

During the production of the piezoelectric actuator with a commonly used method as described above, a lower electrode layer behaves as follows. First of all, a metal paste is coated onto a substrate, and at a stage of calcination, metal particles forming the lower electrode layer are fused and melted with each other to become compact. However, in a subsequent annealing process of the piezoelectric layer performed hereafter, heat is supplied once again to the lower electrode layer. At this time, the grain growth gradually occurs in the particles forming the lower electrode layer, and a grain boundary is developed. Therefore, an element contained in the substrate easily passes through the lower electrode layer along the grain boundary, and the diffusion of the element into the piezoelectric layer becomes significant.

In view of this, the following process for suppressing the diffusion is conceivable. Namely, the calcination temperature and the annealing temperature are made as low as possible to delay the sintering the lower electrode layer, and the lower electrode layer, during the annealing process, is maintained in a state of being compact, thereby suppressing the diffusion. However, when the calcination temperature is lowered, there is a possibility that any sufficient adhesion between the lower electrode layer and an adjacent layer thereto cannot be obtained. Moreover, when sufficient annealing temperature is not ensured, there is a possibility that the piezoelectric characteristics cannot be sufficiently recovered.

In view of such issues, the inventor of the present invention found that a recovery effect of the piezoelectric characteristics and the adhesion can be ensured while suppressing the diffusion of the element diffused between the substrate and the piezoelectric layer during annealing, by providing a diffusion-preventive layer between the substrate and the piezoelectric layer, and by making the diffusion-preventive layer to have a structure having a layer of high melting-start temperature and a layer of low melting-start temperature, thereby completing the present invention.

According to a first aspect of the present invention, there is provided a method of producing a piezoelectric actuator, the method including:

a diffusion-preventive layer forming step of forming, on a substrate, a diffusion-preventive layer including a first diffusion-preventive layer having a melting-start temperature $T_{M1}$ and a maximum shrink temperature $T_{S1}$, and a second diffusion-preventive layer having a melting-start temperature $T_{M2}$ and a maximum shrink temperature $T_{S2}$;

a calcination step of calcinating the diffusion-preventive layer at a calcination temperature $T_C$ which satisfies a relationship of $T_{M1} < T_{M2} < T_C < T_{S1}$;

a piezoelectric layer forming step of forming a piezoelectric layer on the diffusion-preventive layer; and an annealing-process step of annealing the piezoelectric layer at an annealing temperature $T_A$ which satisfies a relationship of $T_{M2} < T_A < T_{S2}$.

According to the present invention, the diffusion-preventive layer having a plurality of stacked layers having mutually different melting-start temperatures is formed between the substrate and the piezoelectric layer; in the calcination step for calcinating the diffusion-preventive layer, the calcination is performed at a temperature, at which the calcination temperature $T_C$ does not exceed the maximum shrink temperature $T_{S1}$ of the first diffusion-preventive layer, and the first diffusion-preventive layer is not completely calcinated ($T_{M1} < T_{M2} < T_C < T_{S1}$); and in the annealing-process step performed after forming the piezoelectric layer, the annealing process is performed at a temperature at which a layer having the highest melting-start temperature is melted.

At this time, first of all, in the calcination step, material particles are melted and the calcination is advanced in the low melting point layer (first diffusion-preventive layer), and the sintered low melting point layer performs a role of adhesion with adjacent layers thereto. Moreover, due to the calcination, the low melting point layer becomes compact and serves to suppress the diffusion of an element from the substrate to other layer. At the same time, a portion of the high melting point layer starts to melt so as to ensure the adhesiveness. On the other hand, in the annealing step, since the grain growth is advanced in the low melting point layer, the diffusion-preventive effect is lost or decreased gradually, but in the high melting point layer (second diffusion-preventive layer), the material particles are melted and the calcination is advanced, thereby forming a compact layer. Accordingly, instead of the low melting point layer, the high melting point layer has a role of the diffusion preventive effect. Moreover, regarding the adhesion, as the calcination temperature is higher, the bonding between the material particles forming the respective layers of the diffusion-preventive layer, and the bonding in an interface between the diffusion-preventive layer and the substrate and an interface between the diffusion-preventive layer and the piezoelectric layer becomes stronger. Therefore, by performing the annealing process at a high temperature, it is possible to ensure the strong adhesion, and to prevent the exfoliation between the layers. Thus, it is possible to ensure the recovery effect of the piezoelectric characteristics, and the adhesion, while suppressing the diffusion of the diffused element between the substrate and the piezoelectric layer.

Regarding the layers which form the diffusion-preventive layer in the present invention, an additional diffusion-preventive layer (third diffusion-preventive layer) may be further provided in addition to the first diffusion-preventive layer and the second diffusion-preventive layer. In other words, the layers forming the diffusion-preventive layer may be three or more layers. Moreover, this plurality of layers may be formed of materials which are mutually different or may be formed of a same material. In particular, when this plurality of layers are formed by the same kind of material mutually having a high affinity, then in the calcination step, this plurality of layers can be made to be adhered strongly, even if the calcination is performed at a temperature at which only a part of the layers, having a low melting-start temperature, is melt, hence preferable.

The diffusion-preventive layer forming step may include a first diffusion-preventive layer forming step of forming the first diffusion-preventive layer on the substrate, and a second diffusion-preventive layer forming step of forming the second diffusion-preventive layer on the first diffusion-preventive layer. This is because, in the calcination step, a layer (first diffusion-preventive layer) included in the plurality of layers and disposed on a side of the substrate is melt, thereby ensuring the adhesion between the substrate and the diffusion-preventive layer; and in the annealing step, a layer (second diffusion-preventive layer) included in the plurality of layers and disposed on a side of the piezoelectric layer is melt, thereby ensuring the adhesion between the diffusion-preventive layer and the piezoelectric layer.

The diffusion-preventive layer may be formed of a non-electroconductive material or may be formed of an electroconductive material. The non-electroconductive material is exemplified by insulative ceramic materials such as alumina and zirconia; the electroconductive material is exemplified by metallic materials such as Au, Pt, Ag, and Ti, or electroconductive oxides such as indium-tin oxide (ITO) and $SrRuO_3$ (SRO). In particular, among the plurality of layers forming the diffusion-preventive layer, when a layer (second diffusion-preventive layer) in contact with the piezoelectric layer is formed of an electroconductive material, this electroconductive layer can also be used as the lower electrode.

In particular, as a material which forms the low-temperature melting layer having a melting-start temperature lower than the other layer or layers, metallic nano-particles having a particle size of nano scale, specifically metallic nano-particles having a particle size of not more than 50 nm can be preferably used. Such metallic fine particles, since having the very small particle size, show properties different than original physical properties of the metal itself, and particularly are known to have a substantially lowered melting point. Therefore, the metallic fine particles can be used preferably as a material which forms a thin film of metal by being subject to a heat treatment at a low temperature.

The material which forms the plurality of layers forming the diffusion-preventive layer, particularly the melting-start temperature of that material, can be selected according to a combination of the materials forming each layer and the temperature condition at the time of annealing process. In the present invention, the material which forms the layer (second diffusion-preventive layer) having the highest melting-start temperature is formed of a material that can be melted at an annealing temperature. Concretely, the maximum shrink temperature $T_{S1}$ of the layer (first diffusion-preventive layer) which is melted at a low temperature may be not more than 600° C., and the maximum shrink temperature $T_{S2}$ of the layer (second diffusion-preventive layer) which is melted at a high temperature may be not less than 650° C.

In the present invention, the first diffusion-preventive layer may be an electrode layer, and another electrode layer may be formed further on the piezoelectric layer. The piezoelectric layer may be formed by the aerosol deposition method. The annealing temperature $T_A$ may be 550° C. to 1,100° C.

Furthermore, according to the present invention, there is provided a method of producing an ink-jet head, the method including: producing a piezoelectric actuator according to the method of the present invention; a driving-electrode forming step of forming a driving electrode on a surface of the piezoelectric layer; and a step of providing the piezoelectric actuator with an ink-channel forming body provided with pressure chambers each of which includes an opening communicating with an ink-discharge nozzle for discharging ink, the opening being open on a side of one surface of the ink-channel forming body.

According to a second aspect of the present invention, there is provided a piezoelectric actuator including:
a substrate;
a first diffusion-preventive layer formed on the substrate;
a second diffusion-preventive layer formed on the first diffusion-preventive layer; and
a piezoelectric layer formed on the second diffusion-preventive layer and subjected to the annealing process at an annealing temperature $T_A$; wherein
a melting-start temperature of the first diffusion-preventive layer $T_{M1}$ is lower than a melting-start temperature $T_{M2}$ of the second diffusion-preventive layer, and the annealing temperature $T_A$ is higher than the melting-start temperature $T_{M2}$ of the second diffusion-preventive layer and is lower than a maximum shrink temperature $T_{S2}$ of the second diffusion-preventive layer.

In the piezoelectric actuator of the present invention, since the first diffusion-preventive layer and the second diffusion-preventive layer respectively have the melting-start temperature and the maximum shrink temperature which satisfy a predetermined relationship, the diffusion of an element between the substrate and the piezoelectric layer during the annealing process is prevented while ensuring the adhesion between the substrate and the piezoelectric layer.

In the piezoelectric actuator of the present invention, the first diffusion-preventive layer may be calcinated at a calcination temperature $T_C$, and the calcination temperature $T_C$ may be higher than the melting-start temperature $T_{M1}$ of the first diffusion-preventive layer, and may be lower than the maximum shrink temperature $T_{S2}$ of the second diffusion-preventive layer. Since the second diffusion-preventive layer is not completely melted when the first diffusion-preventive layer is calcinated, it is possible to decrease a thermal load of the second diffusion-preventive layer in the production process. Accordingly, there is provided a piezoelectric actuator in which satisfactory piezoelectric characteristics and mechanical strength are ensured.

The first diffusion-preventive layer and the second diffusion preventive layer may be formed by a same material and the adhesion of the first diffusion-preventive layer and the second diffusion-preventive layer may be improved. Moreover, the first diffusion-preventive layer may be formed of platinum nano-particles having a particle size of not more than 50 nm, and the second diffusion-preventive layer may be formed of platinum nano-particles having a particle size of not less than 200 nm. Accordingly, it is possible to cause temperature characteristics, particularly the melting-start temperature and the maximum shrink temperature to differ between the first diffusion-preventive layer and the second diffusion-preventive layer while improving the adhesion between the first diffusion-preventive layer and the second diffusion-preventive layer.

The first diffusion-preventive layer and the second diffusion-preventive layer may be used as the electrode layer, and another layer may be further provided on the piezoelectric layer. The piezoelectric layer may be formed by an aerosol deposition method.

BRIEF DESCRIPTION OF THE DRAWINGS

FIG. 2 (2A to 2D) is a cross-section diagram showing a producing process of an actuator plate;

DETAILED DESCRIPTION OF THE PREFERRED EMBODIMENTS

An embodiment of the present invention will be described while referring to FIG. 1 to FIG. 8.

Figure 1:
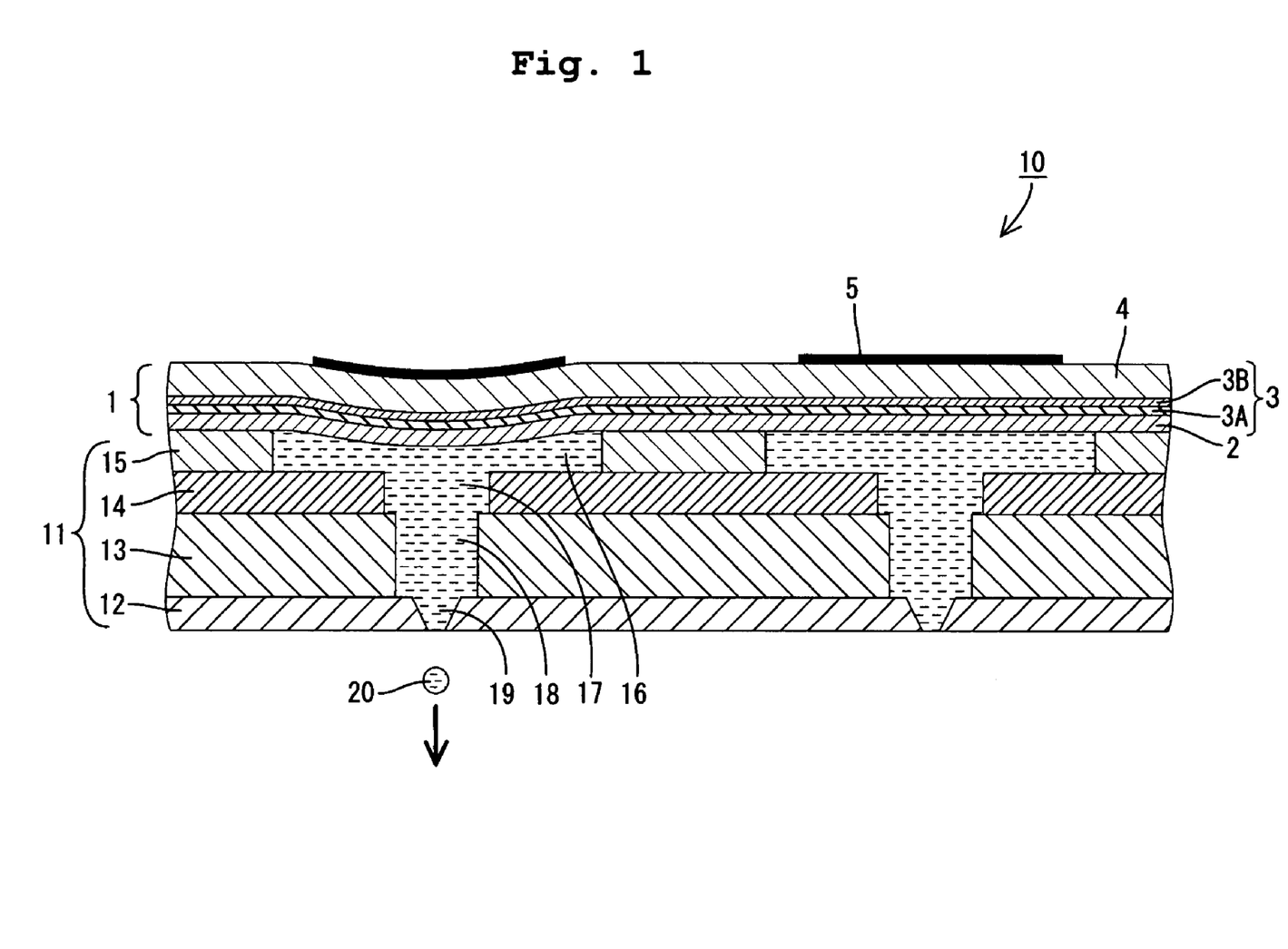
FIG. 1 is a cross-sectional diagram of an ink-jet head of an embodiment of the present invention.

FIG. 1 shows an ink-jet head 10 of the embodiment. The ink-jet head 10 includes a channel unit 11 (ink-channel forming body) which has a plurality of pressure chambers 16 accommodating an ink 20 and an actuator plate 1 (piezoelectric actuator) which is joined to the channel unit 11 so as to close the pressure chambers 16.

The channel unit 11 as a whole is in the form of a flat plate in which a nozzle plate 12, a manifold plate 13, a channel plate 14, and a pressure-chamber plate 15 are laminated in layers in this order. The plates 12, 13, 14, and 15 are joined to one another with an epoxy based thermosetting adhesive.

The nozzle plate 12 is formed of a polyimide-based synthetic resin material, and in the nozzle plate, a plurality of holes which are to become ink-discharge nozzles 19 for jetting ink 20 are formed and aligned. The manifold plate 13 is formed of a metallic material such as stainless steel (SUS 430). In the manifold plate 13, a plurality of holes which are to become nozzle channels 18 connecting the nozzles 19 respectively are provided. The channel plate 14 is formed similarly of the stainless steel (SUS 430), and a plurality of holes which are to become pressure channels 17 communicating with the nozzle channels 18 respectively are provided in the channel plate 14. The pressure-chamber plate 15 is also formed of stainless steel (SUS 430), and in the pressure-chamber plate 15, a plurality of holes which are to become a plurality of pressure chambers 16 communicating with the pressure channels 17 respectively are provided. The pressure chambers 16 are connected to an ink tank (not shown), via a manifold channel and a common ink chamber (not shown in the diagram) provided in the channel plate 14 and manifold plate 13. Thus, ink channels are formed which reach the ink-discharge nozzles 19 from the common ink chamber connected to the ink tank via the manifold channel, the pressure chambers 16, the pressure channels 17, and the nozzle channels 18.

In the actuator plate 1 which is laminated on the channel unit 11, a lower electrode 3, a piezoelectric layer 4, and an upper electrode (electrodes) 5 are laminated in this order on a vibration plate 2 (or substrate) which forms a part of a wall surface of the pressure chambers 16.

The vibration plate 2, formed of a material such as stainless steel (SUS 403) in a rectangular shape, is joined to an upper surface of the channel unit 11 by thermo-compression bonding, and covers an entire upper surface of the channel unit 11. Further, this vibration plate 2 is formed of the same type of a metallic material as for the manifold plate 13, the channel plate 14, and the pressure chamber plate 15 which form the channel unit 11. Accordingly, it is possible to prevent warpage or curling during the thermo-compression bonding of the vibration plate 2 to the channel unit 11.

The lower electrode 3 is formed over an entire upper surface (surface on an opposite side of a surface in contact with the channel unit 11) of the vibration plate 2. This lower electrode 3 also serves as a diffusion-preventive layer for preventing diffusion of an element such as Fe and Cr contained in the vibration plate 2, and has a two-layered structure formed of layers of electroconductive materials having mutually different melting-start temperatures. A layer on a lower side (a side in contact with the vibration plate 2) is a low-temperature melting layer 3A (first diffusion-preventive layer) formed of metal nano-particles having a particle size of not more than 50 nm, such as platinum nano-particles. On the other hand, a layer on an upper side (a side in contact with the piezoelectric layer 4) is a high-temperature melting layer 3B (second diffusion-preventive layer) formed of platinum particles having the same constituents as the particles which form the low-temperature melting layer 3A, and having a particle size bigger than the particles which form the low-temperature melting layer 3A. This lower electrode 3 is connected to a ground terminal of a driving circuit IC (not shown in the diagram) and is used as a ground electrode.

The piezoelectric layer 4, formed on an upper surface (surface on a reverse side of a surface adhered to the vibration plate 2) of the lower electrode 3, is formed of a ferroelectric piezoelectric ceramics material such as lead zirconate titanate (PZT), and is laminated with a uniform thickness on an entire surface of the vibration plate 2, while sandwiching the lower electrode 3 between the piezoelectric layer 4 and the vibration plate 2. This piezoelectric layer 4 is formed by the aerosol deposition (AD) method, and a polarization process is performed on the piezoelectric layer 4 such that the piezoelectric layer 4 is polarized in a direction of thickness of the piezoelectric layer 4.

A plurality of upper electrodes 5 are provided on an upper surface (surface on a reverse side of a surface to which the lower electrode 3 is tightly adhered) of the piezoelectric layer 4. Each of the upper electrodes 5 is provided on the upper surface of the piezoelectric layer 4 at an area corresponding to one of the pressure chambers 16 of the pressure chamber plate 15. These upper electrodes 5 are connected to the driving circuit IC via lead portions (not shown in the diagram) respectively.

At the time of printing, when a predetermined drive signal is outputted from the driving circuit IC, an electric potential of an upper electrode 5 becomes higher than an electric potential of the lower electrode 3, and an electric field is applied in a polarization direction (direction of thickness) of the piezoelectric layer 4. Then, the piezoelectric layer 4 is extended in the thickness direction and is contracted in a plane direction. Accordingly, in the piezoelectric layer 4 and the vibration plate 2 (namely, in the actuator plate 2), an area corresponding to an opening 16A of the pressure chamber 16 is locally deformed (unimorph deformation) to project towards the pressure chamber 16. Therefore, a volume of the pressure chamber 16 is decreased, a pressure of the ink 20 is increased, and the ink 20 is jetted from the ink-discharge nozzle 19. Thereafter, when the upper electrode 5 returns to an electric potential same as the electric potential of the lower electrode 3, the piezoelectric layer 4 and the vibration plate 2 restore to their original shape and the volume of the pressure chamber 16 returns to the original volume, thereby sucking the ink 20 from the manifold channel communicating with the ink tank.

Next, a method of producing this ink-jet head 10 will be explained. First of all, holes which are to become the nozzle channels 18, the pressure channels 17, and the pressure chambers 16 are formed by etching in the manifold plate 13, the channel plate 14, and the pressure chamber plate 15 respectively. These plates 13 to 15 are formed of stainless steel. Next, the manifold plate 13, the channel plate 14, and the pressure chamber plate 15 are joined in a laminated state, thereby forming a substantial part of the channel unit 11 (step for forming channel-unit forming body). Further, since the nozzle plate 12 is formed of a synthetic resin material, the nozzle plate 12 is melted when heated at the time of annealing process which will be described later. Therefore, the nozzle plate 12 is not joined at this time but will be joined after the annealing process.

Figure 2A:
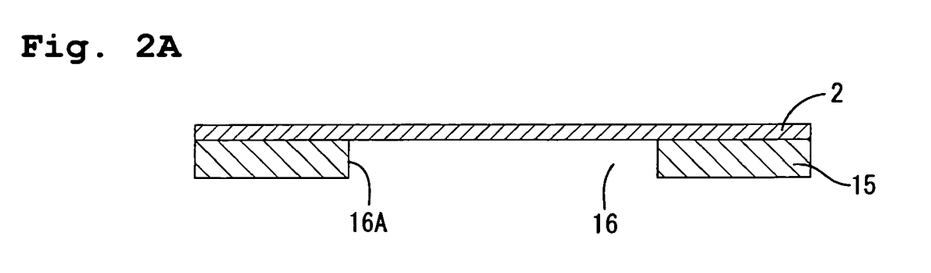

Next, as shown in FIG. 2A, the vibration plate 2 formed of stainless steel is overlapped while being positioned on the upper surface of the pressure chamber plate 15 in the channel unit 11, and joined to the pressure chamber plate 15 by thermo-compression bonding, thereby closing the pressure chambers 16 by the vibration plate 2 (vibration plate joining step).

Figure 2B:
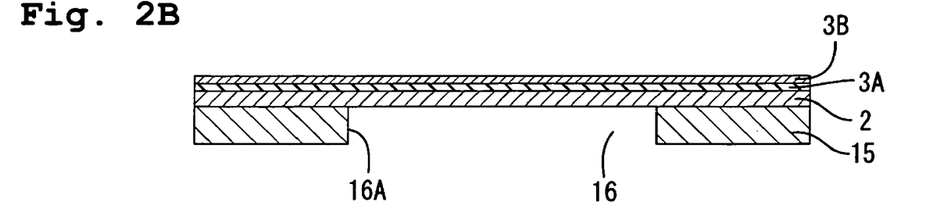

Next, as shown in FIG. 2B, the lower electrode 3 which also serves as the diffusion-preventive layer is formed on the vibration plate 2 (diffusion-preventive layer forming step). First of all, a paste is prepared in which platinum nano-particles having particle size of not more than 50 nm, such as platinum particles of 50 nm (or 10 nm or 5 nm) are dispersed in a dispersing agent. Further, by coating this paste on the vibration plate 2, and by drying this paste, the low-temperature melting layer 3A is formed on the vibration plate 2 (first diffusion-preventive layer forming step). Next, a paste is prepared in which platinum particles having a particle size bigger than the platinum nano-particles as described above, such as platinum particles of 200 nm, are dispersed in a dispersing agent. Further, by coating this paste on the low-temperature melting layer 3A, and by drying this paste, the high-temperature melting layer 3B is formed (second diffusion-preventive layer forming step). Thus, the lower electrode 3 formed of two layers, namely including the low-temperature melting layer 3A and the high-temperature melting layer 3B is formed. The melting-start temperature of the low-temperature melting layer 3A and the melting-start temperature of the high-temperature melting layer 3B are mutually different.

Next, this lower electrode 3 is calcinated (calcination step). The calcination is performed at a temperature at which the platinum particles forming the high-temperature melting layer 3B are not completely melted but only the platinum particles forming the low-temperature melting layer 3A are melted. In this embodiment, the calcination is performed at a temperature from 350° C. to 500° C. In this case, since the platinum particles are a low melting point material which is melted and fused at a temperature substantially lower than the original melting point of the metal, the platinum particles start melting at an extremely low temperature from approximately 100° C. to 200° C., and are adhered tightly to the vibration plate 2 and the high-temperature melting layer 3B. It is known that as the particle size is smaller, the melting-start temperature becomes lower, and, for example, in a case of the particle size of about 10 nm, the melting starts at 150° C. Since the low-temperature melting layer 3A and the high-temperature melting layer 3B are formed of the same material (in this case platinum), these layers have high affinity for each other, and are adhered strongly even when calcinated at a temperature at which only the low-temperature melting layer 3A is melted. Moreover, the low-temperature melting layer 3A becomes compact due to the sintering of the particles of the low-temperature melting layer 3A by the low-temperature calcination, thereby preventing the diffusion of an element from the vibration plate 2 to the low-temperature melting layer 3A. Therefore, the low-temperature melting layer 3A functions as a diffusion-preventive layer at the time of calcination.

Figure 2C:
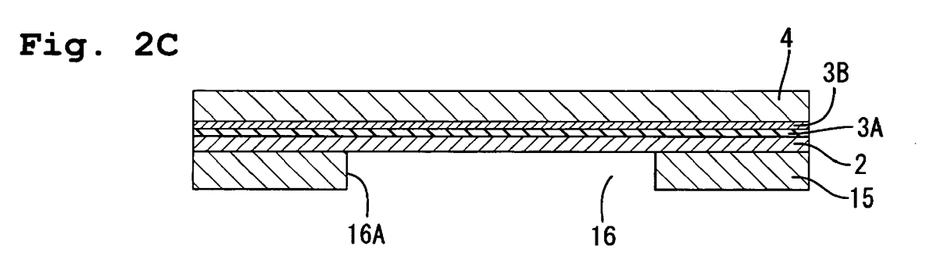
Figure 3:
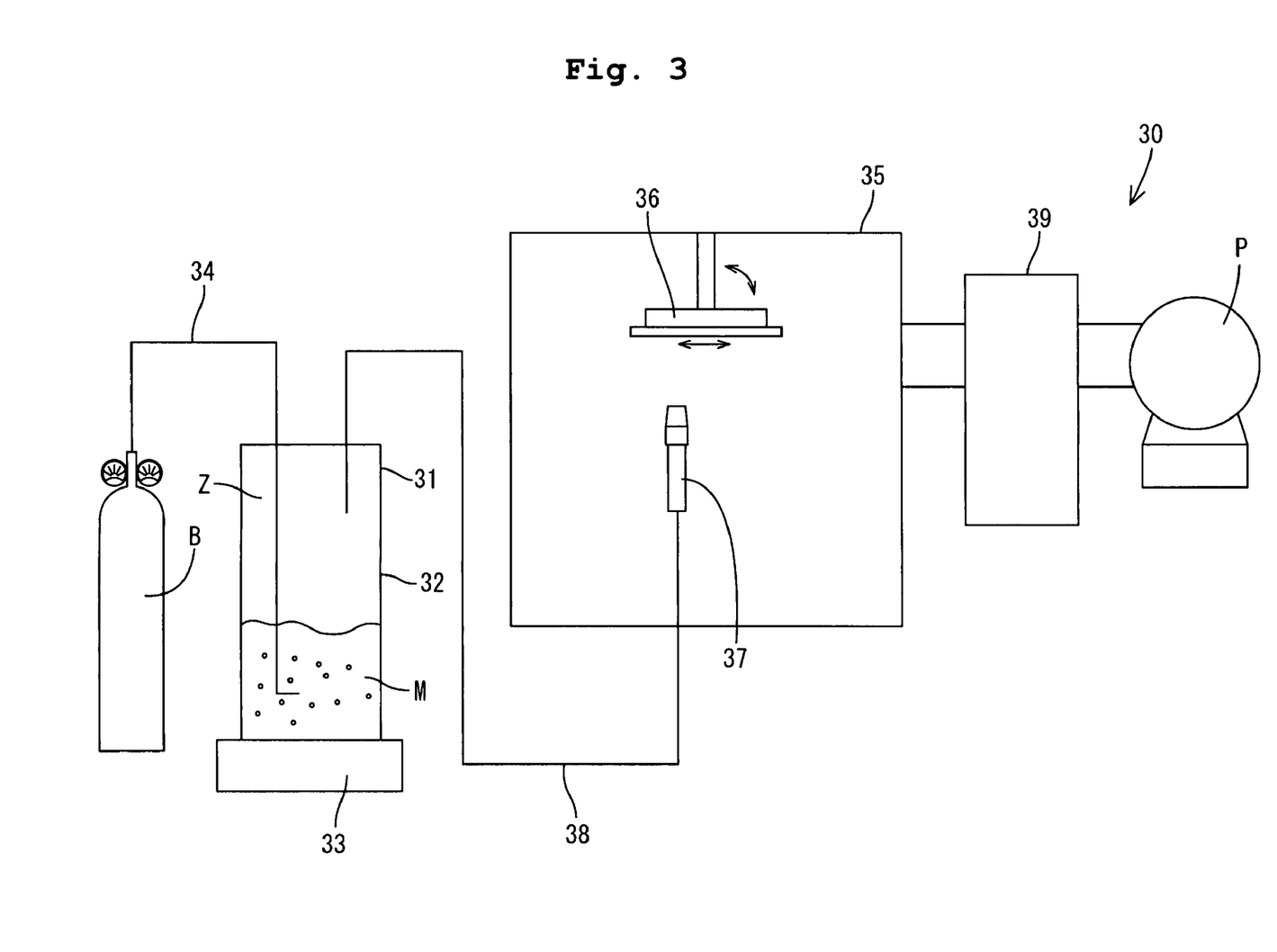
FIG. 3 is a schematic diagram of a film forming apparatus using the AD method.

Next, as shown in FIG. 2C, the piezoelectric layer 4 is formed by the aerosol deposition method (AD method) (piezoelectric layer forming step). In FIG. 3, a schematic diagram of a film forming apparatus 30 for forming the piezoelectric layer 4 is shown. This film forming apparatus 30 includes an aerosol generator 31 which forms an aerosol Z by dispersing material particles M in a carrier gas, and a film forming chamber 35 for adhering aerosol Z on a substrate by jetting the aerosol Z from an ejection nozzle 37.

The aerosol generator 31 includes an aerosol chamber 32 capable of accommodating the material particles M inside thereof, and a vibration unit 33 which is attached to the aerosol chamber 32 and which causes the aerosol chamber 32 to vibrate. A gas cylinder B for introducing the carrier gas is connected to the aerosol chamber 32 via an introduction pipe 34. An end of the introduction pipe 34 is positioned near a bottom surface in the aerosol chamber 32, and is buried in the material particles M. As the carrier gas, an inert gas such as helium, argon, and nitrogen, or a gas such as air and oxygen can be used.

The film forming chamber 35 includes a stage 36 for attaching or mounting the substrate where the piezoelectric layer 4 will be formed, and the ejection nozzle 37 which is provided below the stage 36. The ejection nozzle 37 is connected to the aerosol chamber 32 via an aerosol supply pipe 38 so as to supply the aerosol Z in the aerosol chamber 32 to the ejection nozzle 37 via the aerosol supply pipe 38. Moreover, a vacuum pump P is connected to this film forming chamber 35 via a powder recovery unit 39 so as to decompress the inside of the film forming chamber 35.

When the piezoelectric layer 4 is formed by using this film forming apparatus 30, first of all, the vibration plate 2 is set in the stage 36. Next, the material particles M are charged into the aerosol chamber 32. As the material particles M, for example, lead zirconate titanate (PZT) can be used.

Then, the carrier gas is introduced from the gas cylinder B, the material particles M are allowed to rise up by a gas pressure. At the same time, the aerosol chamber 32 is vibrated by the vibration unit 33, thereby mixing the material particles M with the carrier gas to generate the aerosol Z. Further, the inside of the film forming chamber 35 is decompressed by the vacuum pump P to generate a pressure difference between the aerosol chamber 32 and the film forming chamber 35, the aerosol Z in the aerosol chamber 32 is ejected from the ejection nozzle 37 while accelerating the aerosol to a high velocity. The material particles M contained in the ejected aerosol Z are collided on the vibration plate 2 and deposited on the vibration plate 2, thereby forming the piezoelectric layer 4.

Next, for obtaining the required piezoelectric characteristics, the annealing process is performed on the formed piezoelectric layer 4 (annealing process step). At this time, to sufficiently recover the piezoelectric characteristics, the annealing process needs to be performed at a high temperature to some extent and for a sufficient period of time. As an annealing temperature, in case of this embodiment (when the piezoelectric material is lead zirconate titanate), temperature from 550° C. to 1,100° C. is suitable. However, because of a high-temperature annealing atmosphere, an element contained in the vibration plate 2 is diffused in the piezoelectric layer 4, resulting in causing the degradation of the piezoelectric characteristics. However, in this embodiment, by providing the lower electrode 3 having a diffusion-preventive function between the vibration plate 2 and the piezoelectric layer 4, the diffusion can be suppressed.

Figure 4:
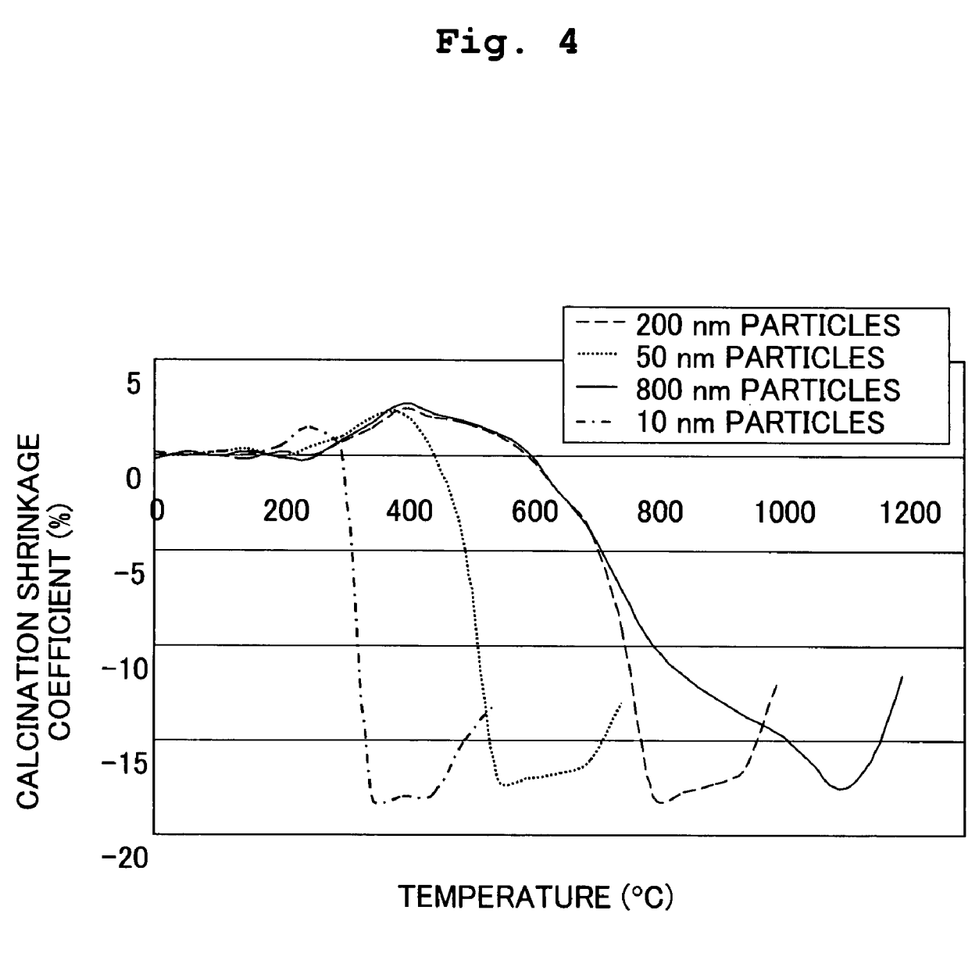
FIG. 4 is a graph showing a change in a shrinkage coefficient of diffusion-preventive layers, formed of platinum particles having different average particle sizes respectively, with respect to temperature.

Here, difference in a behavior of the metal particles during calcination due to a difference in the particle size of the metal particles will be considered while referring to FIG. 4 to FIG. 7. In FIG. 4, there is shown a graph showing a process of calcination (change in calcination shrinkage coefficient) of electrode layers using platinum particles having average particle size of 10 nm, 50 nm, 200 nm (0.2 μm), and 800 nm (0.8 μm), respectively. The calcination shrinkage coefficient was calculated from a measured value of stress exerted on the electrode layer measured with a stress measurement device.

Figure 5:
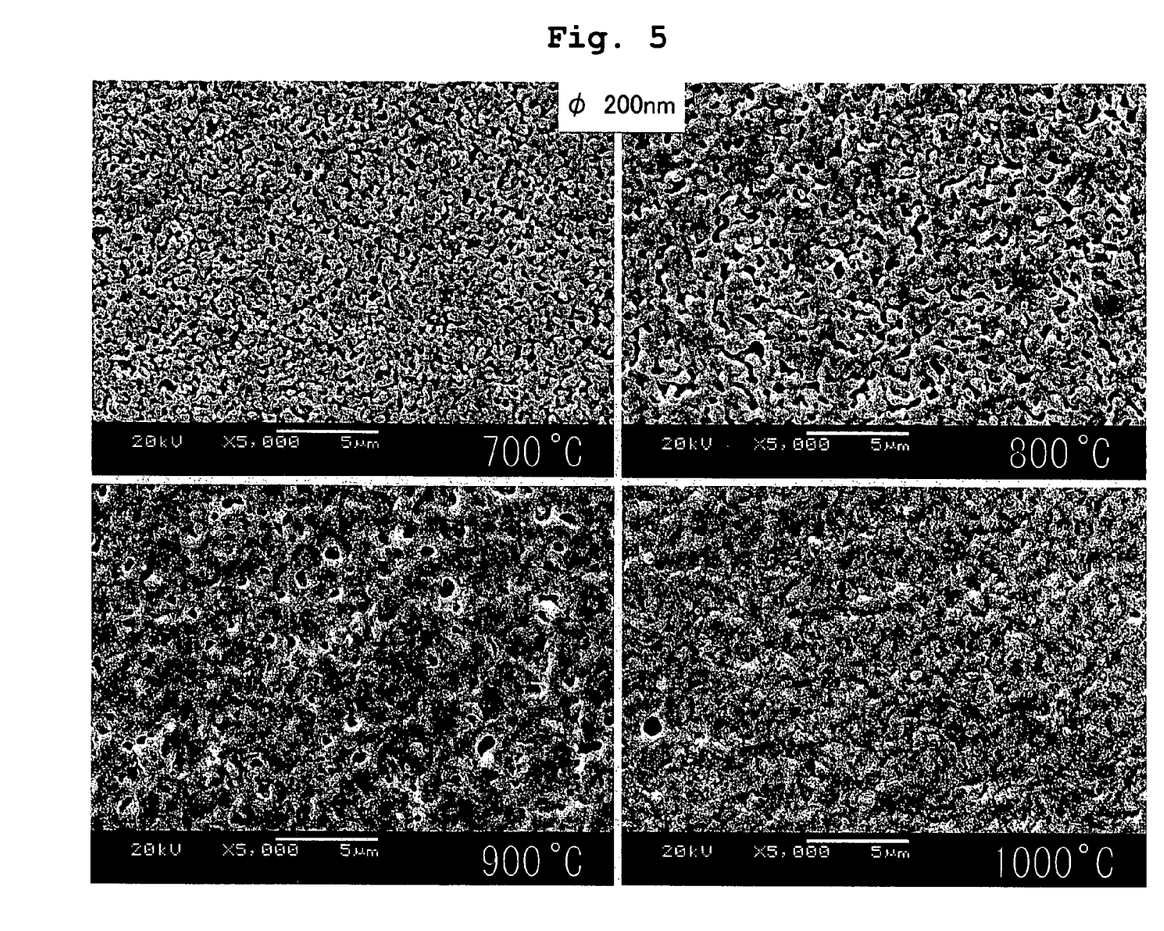
FIG. 5 shows pictures taken by an electron microscope showing melting at 700° C., 800° C., 900° C., and 1000° C. respectively when platinum particles having an average particle size of 200 nm are used.
Figure 6:
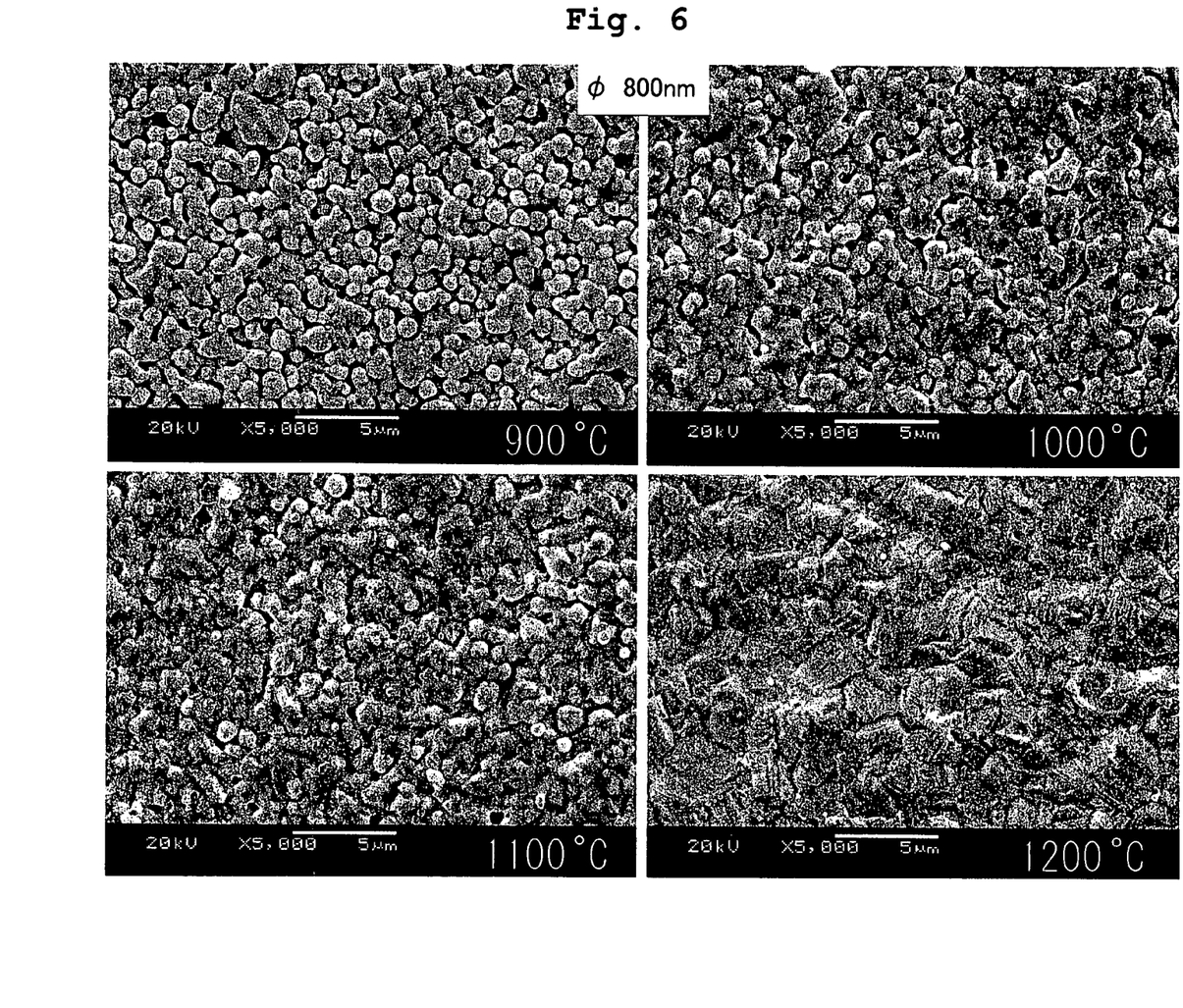
FIG. 6 shows pictures taken by the electron microscope showing melting at 900° C., 1000°, 1100° C., and 1200° C. respectively when platinum particles having an average particle size of 800 nm are used.
Figure 7:
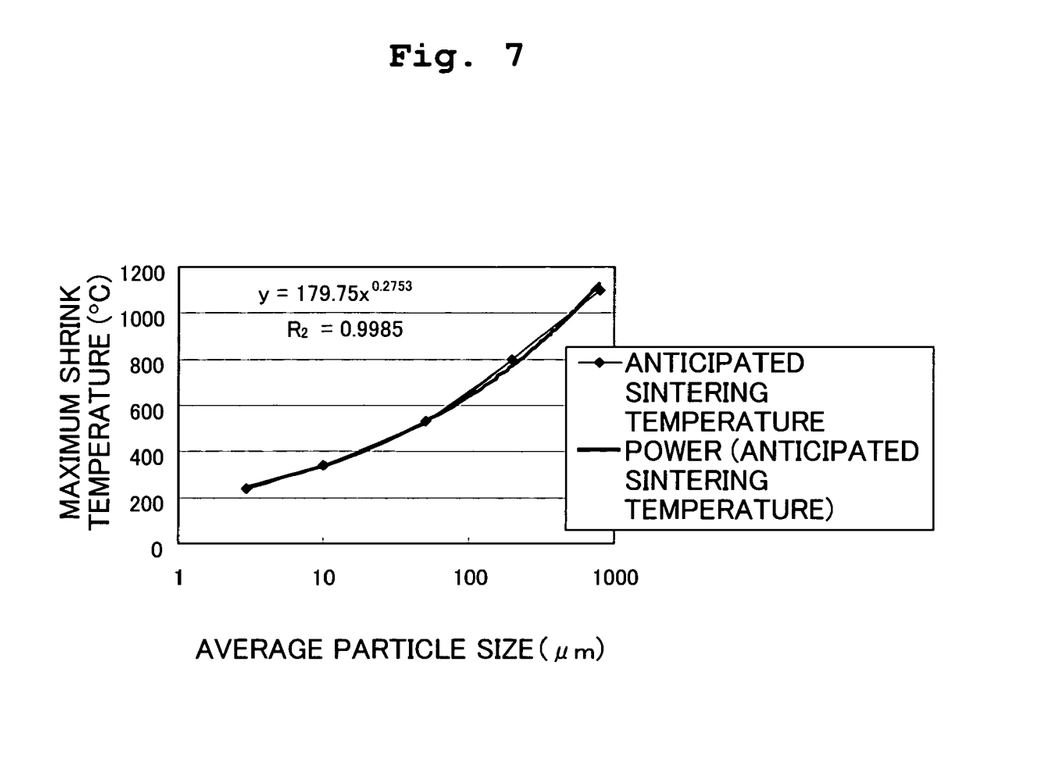
FIG. 7 is a graph showing a change in the maximum-shrink temperature with respect to the average particle size obtained from FIG. 4.

Further, FIG. 5 shows pictures taken by an electron microscope showing the melting at 700° C., 800° C., 900° C., and 1000° C. when platinum particles having an average particle size of 200 nm are used. FIG. 6 shows pictures taken by the electron microscope showing the melting at 900° C., 1000° C., 1100° C., and 1200° C. when platinum particles having an average particle size of 800 nm are used. Furthermore, FIG. 7 shows a change in the maximum shrink temperature with respect to the average particle size obtained from FIG. 4.

As appreciated from the change in the calcination shrinkage coefficient with respect to the change in temperature shown in FIG. 4, when the particle size of the platinum particles is 200 nm, at a temperature of approximately 250° C., the shrinkage coefficient is increased from 0% to a significant positive value. This temperature is considered to be the melting-start temperature at which the platinum particle start to melt. The temperature rises further and the electrode layer is expanded or bloated temporarily (shrinkage coefficient is in a positive range). When the temperature rises furthermore, the shrinkage coefficient is changed to negative. The temperature at which the shrinkage coefficient becomes 0% once again, is considered to be a temperature at which the particles start to become compact. Thus, with the rise in the temperature, the electrode layer (diffusion-preventive layer) keeps shrinking due to the adhesion of particles while the particles are mutually dragged. Further, the particles are melted completely at approximately 800° C. to 900° C. Hereafter, the grain growth is then started and due to the increase in grain boundary, the electrode layer is considered to be expanded again. In FIG. 5, it is appreciated that with the rise in the temperature, gaps between the particles of 200 nm are filled up due to the melting of particles. Here, a shrinkage coefficient and a temperature at an inflection point of a curve (range of negative shrinkage coefficient), showing the change in the shrinkage coefficient with respect to the change in temperature, indicates the maximum shrinkage coefficient and expansion-start temperature or maximum shrink temperature respectively, and when a temperature exceeds the maximum shrink temperature, the expansion of the electrode starts again.

When the average particle size of the platinum particles is 800 nm, the particles behaves substantially similar as the layer of particle size 200 nm behaves. However, since these particles having a particle size of 800 nm have a greater particle size, the particles require, until the particles are completely melted, namely until the particles are expanded again, a higher temperature than in the case of particle size of 200 nm, and thus the electrode layer continues to shrink up to approximately 1100° C. to 1200° C. Further, at a temperature beyond approximately 1100° C. (expansion-start temperature: maximum shrink temperature), at which the grain growth is started, and the electrode layer starts to expand again. Looking at the picture of 1200° C. in FIG. 6, it is appreciated that the gaps of the metal particles, which were appeared up to 1100°, have disappeared due to the melting, and the grain boundary (border) is developed to an extent surpassing 1 μm. Thus, according to the particle size of the metal particles which form the electrode layer, there is a difference in the temperature at which the electrode layer changes from being compact to starting expansion (expansion-start temperature: maximum shrink temperature).

Furthermore, it is appreciated that when the average particle size becomes 50 nm, as shown in FIG. 4, the temperature at which the calcination shrinkage coefficient starts increasing, in other words, when the melting-start temperature (approximately 200° C.) is further lowered, and the temperature at which the shrinkage coefficient becomes 0% once again (temperature at which particles becomes compact: approximately 400° C.) and the temperature at which the shrinkage coefficient becomes the maximum (maximum shrink temperature: approximately 560° C.) becomes lower than those in a case of the average particle size of 200 nm. Moreover, it can be appreciated that when the average particle size becomes 10 nm, as shown in FIG. 4, the melting-start temperature (approximately 150° C.) is lowered further; and, the temperature at which the shrinkage coefficient becomes 0% once again (temperature at which the particles become compact: approximately 260° C.) and the temperature at which the shrinkage coefficient becomes the minimum (maximum shrink temperature: approximately 320° C.) becomes lower than those in a case of the average particle size of 50 nm.

Figure 8:
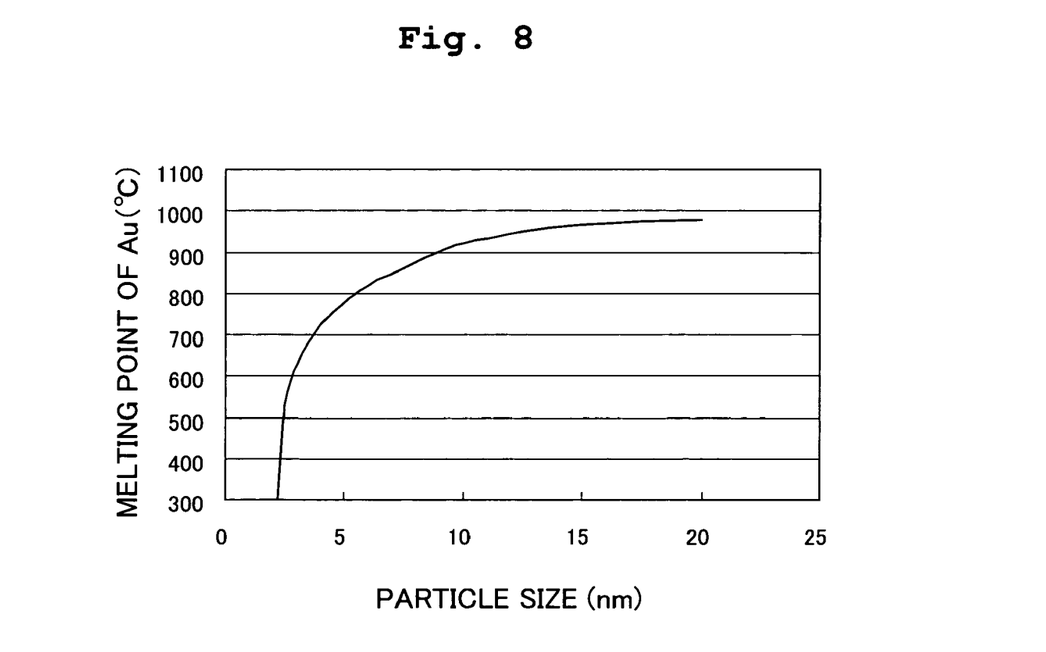
FIG. 8 is a graph showing a change in a melting point with respect to a particle size of gold.

The calcination shrinkage coefficient of the average particle size 50 nm and 10 nm was calculated as follows, by using a paste including commercially available metal particles. According to the knowledge of the inventor, it is revealed that the behavior of the platinum particles resembles substantially to a behavior of particles of gold which is also a precious metal. Moreover, a logarithmic indication of the maximum shrink temperature with respect to the various average particle sizes is expected to be substantially linear. Based on such knowledge, the inventor obtained, by calculating at each temperature (power regression $y=b*x^n$), the shrinkage coefficient for the average particle size 10 nm and 50 nm with a value at the maximum shrink temperature from 230° C. to 250° C. (catalogue value of HARIMA CHEMICALS, INC.) as a reference value (240° C.), by using a paste of gold particles having the average particle size of 3 nm (HARIMA CHEMICALS, INC.: NPG-J). Specifically, as shown in FIG. 7, temperatures (maximum shrink temperatures) showing the maximum shrinkage coefficient which is obtained from data for the average particle size of 3 nm, 200 nm, and 800 nm respectively are plotted, and an approximate curve was determined such that the minimum square error (here $(1-R^2)$) of the approximate curve (=power regression curve) becomes the minimum ($b=179.75$, $n=0.2753$, $R^2=0.9985$). In this case, $R^2$ is also called as a coefficient of determination, and is an index which is commonly used as a value showing a statistical certainty. The coefficient of determination is an amount of statistic expressing a proportion of a portion where a variation of Y can be explained by a variation of X when a variable Y (explained variable) is subjected to regression analysis by a certain variable X (explanatory variable). The coefficient of determination takes a value between 0 and 1, (it shows that as the coefficient of determination is closer to 1, the proportion of the portion which can be explained is higher). Based on this determined approximate curve, temperatures at which the particle size of 10 nm and 50 nm attain the maximum shrinkage coefficient (maximum shrink temperature) respectively were estimated, and temperature of 340° C. for 10 nm and temperature of 530° C. for 50 nm were calculated. It is clear that details of physical changes occurred in the shrinkage coefficient (expansion→shrinkage→expansion again) in cases in which the same material is used except that the particle size is changed, does not basically change except that the temperature of occurrence is changed. Accordingly, based on a change in the maximum shrink temperature for particle size of 200 nm for which an effect on a surface area per unit volume is substantial, the change in the shrinkage coefficient in a case of the particle size of 10 nm and 50 nm, is considered to change steeply with a decrease in the particle size, upon considering a ratio of the maximum shrink temperature (800° C.) at the particle size of 200 nm and the maximum shrink temperatures (340° C., 530° C.) at the particle size of 10 nm and 50 nm respectively, which were calculated earlier, and was determined to have a change in the form of a curve as shown in FIG. 4. Moreover, for reference purpose, a graph showing a change in the melting point with respect to the particle size of gold is shown in FIG. 8. According to this graph, it is appreciated that the melting point (temperature characteristic) changes depending on the particle size. However, the melting point in this case does not indicate the melting-start temperature, but a temperature at which the particles are melted completely.

The platinum particles having the average particle size of 200 nm or 800 nm mentioned above form the high-temperature melting layer 3B in this embodiment, and the platinum particles having the average particle size of 10 nm or 50 nm form the low-temperature melting layer 3A in this embodiment. Moreover, a layer formed by using gold particles having an average particle size of 3 nm (the melting-start temperature is 150° C.) can also be used as the low-temperature melting layer 3A. In other words, the high-temperature melting layer 3B has the melting-start temperature and the maximum shrink temperature higher than the melting-start temperature and the maximum shrink temperature of the low-temperature melting layer 3A.

In the annealing process step of this embodiment, the high-temperature heating (900° C. in this case) is performed to an extent such that the piezoelectric characteristics of the piezoelectric layer 4 are recovered sufficiently. At this time, in the low-temperature melting layer 3A, the particles of platinum are completely melted and are changed to grain growth, and due to the development of the grain boundary, the diffusion-preventive function is reduced or lost. This is because the annealing temperature $T_A$ is higher than a temperature indicating the maximum shrinkage coefficient (maximum shrink temperature $T_{S1}$) of the low-temperature melting layer 3A. However, in the calcination step performed before the calcination step, since the melting-start temperature $T_{M1}$ of the low-temperature melting layer 3A is comparatively low, the calcination temperature $T_C$ also may be comparatively low. Therefore, in the calcination step, the calcination temperature $T_C$ does not exceed the maximum shrink temperature $T_{S1}$ of the low-temperature melting layer 3A, and the low-temperature melting layer 3A is not completely calcinated ($T_{M1}<T_{M2}<T_C<T_{S1}$). In the annealing step, since the melting-start temperature $T_{M1}$ of the high-temperature melting layer 3B is higher than the annealing temperature $T_A$, the particles of platinum in the high-temperature melting layer 3B are melted and become compact. However, since the annealing temperature $T_A$ does not exceed the maximum shrink temperature $T_{S2}$ of the high-temperature melting layer 3B, the grain boundary is not developed ($T_{M2}<T_A<T_{S2}$). Therefore, the high-temperature melting layer 3B has the diffusion-preventive effect. Accordingly, the diffusion from the vibration plate 2 to the piezoelectric layer 4 is suppressed. Moreover, the high-temperature melting layer 3B which is melted and calcinated is tightly adhered to the piezoelectric layer 4, and the adhesion with the piezoelectric layer 4 and the high-temperature melting layer 3B is ensured. Furthermore, due to the annealing at a high temperature (calcination), the bonding of the low-temperature melting layer 3A with the adjacent vibration plate 4 and an interface with high-temperature melting layer 3B becomes stronger. Accordingly, it is possible to prevent an exfoliation between the layers. With such principle, in the annealing process step, the prevention of the diffusion from the substrate to the piezoelectric layer is facilitated.

Figure 2D:
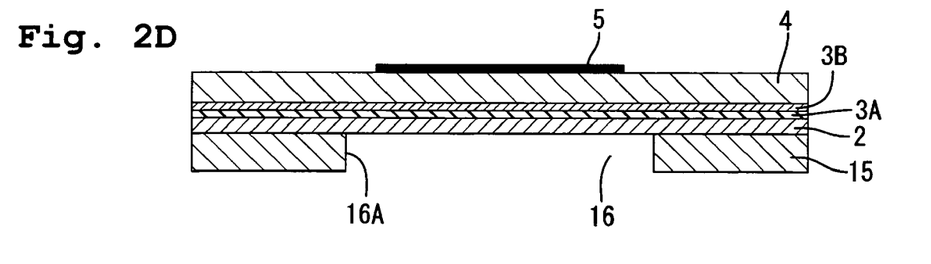

Back to the producing process shown in FIGS. 2A to 2D, as shown in FIG. 2D, the upper electrodes 5 and a plurality of lead portions (not shown in the diagram) connected to the upper electrodes 5 respectively are formed at areas on the upper surface of each piezoelectric layer 4, each of the areas corresponding to one of the pressure chambers 16 (driving electrode forming step). For forming the upper electrodes 5 and the lead portions, for example, after forming a conductor film on the entire area of the piezoelectric layer 4, a predetermined pattern may be formed by using a photolithographic etching method, or may be formed by screen printing directly on the upper surface of the piezoelectric layer 4.

Afterwards, an electric field stronger than at the time of a normal ink-jetting operation is applied between the upper electrodes 5 and the lower electrode 3, and the piezoelectric layer 4 of both the electrodes is polarized in the direction of thickness (polarizing step). Finally, the nozzle plate 12 is joined to the manifold plate 13, thus completing the actuator plate 1.

According to the embodiment described above, the lower electrode 3 made of the low-temperature melting layer 3A and the high-temperature melting layer 3B having mutually different melting-start temperatures is provided between the vibration plate 2 and the piezoelectric layer 4. Further, in the calcination step of calcinating this lower electrode 3, the calcination is performed at a low temperature at which the calcination temperature $T_C$ does not exceed the maximum shrink temperature $T_{S1}$ of the low-temperature melting layer 3A, and the low-temperature melting layer 3A is not completely calcinated ($T_{M1} < T_{M2} < T_C < T_{S1}$), and in the annealing process step of the piezoelectric layer 4, the annealing process is performed at a high temperature at which the particles in the high-temperature melting layer 3B are melted and become compact.

At this time, first of all, in the calcination step, the melting of platinum nano-particles occurs in the low-temperature melting layer 3A, and performs a role of the adhesion with adjacent layers thereto. Further, the low-temperature melting layer 3A becomes compact due to the calcination, thereby suppressing the diffusion of element from the vibration plate 2 to other layer or layers. Furthermore, in the annealing step, since the grain growth is advanced in the low-temperature melting layer 3A, the diffusion-preventive effect is decreased or lost, but in the high-temperature melting layer 3B, the platinum particles are melted to form a compact layer which has a role of the diffusion-preventive effect.

Furthermore, the low-temperature melting layer 3A and the high-temperature melting layer 3B are formed of the same material. Accordingly, in the calcination step, even when the calcination is performed at a temperature to the extent at which only the low-temperature melting layer 3A is melted, it is possible to allow the low-temperature melting layer 3A and the high-temperature melting layer 3B to be adhered tightly. Moreover, in the annealing-process step, by performing the calcination at a high temperature, the bonding between the metal particles forming the respective layers of the lower electrode 3, the bonding in the interface between the lower electrode 3 and the vibration plate 2 and in the interface between the lower electrode 3 and the piezoelectric layer 4 become strong. Therefore, it is possible to ensure the strong adhesion and to prevent the exfoliation of the layers.

The technical scope of the present invention is not limited to the embodiment as described above, and the following cases as described below are also included in the technical scope of the present invention.

(1) In the above-mentioned embodiment, the lower electrode 3 which also serves as the diffusion-preventive layer is made to have a two-layered structure of the low-temperature melting layer 3A and the high-temperature melting layer 3B. However, the structure of the diffusion-preventive layer is not limited to the structure in this embodiment, and the structure may be three layered.

(2) In the abovementioned embodiment, the low-temperature melting layer 3A and the high-temperature melting layer 3B are formed of particles of platinum. However, the low-temperature melting layer 3A and the high-temperature melting layer 3B may be formed of particles of other metals, such as silver or gold. Moreover, the plurality of layers forming the diffusion-preventive layer need not be necessarily formed of a same material, and may be formed of different metallic materials. For example, a paste, in which gold nano-particles having particle size of about 5 nm (having melting-start temperature of approximately 150° C. and maximum shrink temperature of approximately 220° C. to 250° C.) are dispersed, may be used as the low-temperature melting layer 3A, and a paste, in which platinum particles having the particle size of 200 nm (having melting-start temperature of approximately 200° C. and maximum shrink temperature of approximately 800° C.) are dispersed in a dispersing agent, may be used as the high-temperature melting layer 3B.

(3) In the abovementioned embodiment, both the low-temperature melting layer 3A and the high-temperature melting layer 3B are formed of an electroconductive material. However, only a part of the layers may be formed of the electroconductive material, and the other layer or layers may be formed of a non-electroconductive material such as alumina. Specifically, a layer in contact with the substrate may be an alumina layer, and the low-temperature melting layer and the high-temperature melting layer which are made of a metallic material and which also serve as the lower electrode may be laminated on the alumina layer.

(4) In the abovementioned embodiment, the nozzle plate 12 is formed of a synthetic resin material. However, similarly as the manifold plate 13, the nozzle plate 12 may be formed of a metallic material such as stainless steel (SUS 430). In this case, the nozzle plate 12 may be joined together with the manifold plate 13, the channel plate 14, and the pressure chamber plate 15, in the channel-unit forming step.

What is claimed is:

1. A method of producing a piezoelectric actuator comprising:
   a diffusion-preventive layer forming step of forming, on a substrate, a diffusion-preventive layer including a first diffusion-preventive layer having a melting-start temperature $T_{M1}$ and a maximum shrink temperature $T_{S1}$, and a second diffusion-preventive layer having a melting-start temperature $T_{M2}$ and a maximum shrink temperature $T_{S2}$;
   a calcination step of calcinating the diffusion-preventive layer at a calcination temperature $T_C$ which satisfies a relationship of $T_{M1} < T_{M2} < T_C < T_{S1}$, prior to forming a piezoelectric layer on the diffusion-preventive layer;
   a piezoelectric layer forming step of forming the piezoelectric layer on the diffusion-preventive layer; and
   an annealing-process step of annealing the piezoelectric layer at an annealing temperature $T_A$ which satisfies a relationship of $T_{M2} < T_A < T_{S2}$.

2. The method of producing the piezoelectric actuator according to claim 1, wherein the diffusion-preventive layer forming step includes a first diffusion-preventive layer forming step of forming the first diffusion-preventive layer on the substrate, and a second diffusion-preventive layer forming step of forming the second diffusion-preventive layer on the first diffusion-preventive layer.

3. The method of producing the piezoelectric actuator according to claim 1, wherein, among the first diffusion-preventive layer and the second diffusion-preventive layer, at least a layer which makes contact with the piezoelectric layer is formed of an electroconductive material.

4. The method of producing the piezoelectric actuator according to claim 1, wherein the first diffusion-preventive layer and the second diffusion-preventive layer are formed of a same kind of material.

5. The method of producing the piezoelectric actuator according to claim 1, wherein the first diffusion-preventive layer is formed of metal nano-particles having a particle size of not more than 50 nm.

6. The method of producing the piezoelectric actuator according to claim 1, wherein the maximum shrink temperature $T_{S1}$ of the first diffusion-preventive layer is not more than 600° C., and the maximum shrink temperature $T_{S2}$ of the second diffusion-preventive layer is not less than 650° C.

7. The method of producing the piezoelectric actuator according to claim 1, wherein the first diffusion-preventive layer is an electrode layer, and further comprising forming another electrode layer on the piezoelectric layer.

8. The method of producing the piezoelectric actuator according to claim 1, wherein the piezoelectric layer is formed by an aerosol deposition method.

9. The method of producing the piezoelectric actuator according to claim 1, wherein the annealing temperature $T_A$ is 550° C. to 1,100° C.

10. A method of producing an ink-jet head comprising:
producing a piezoelectric actuator by the producing method as defined in claim 1;
a driving-electrode forming step of forming a driving electrode on an upper surface of the piezoelectric layer;
a step of providing the piezoelectric actuator with an ink channel forming body provided with pressure chambers each of which includes an opening communicating with an ink-discharge nozzle for discharging ink, the opening being open on a side of one surface of the ink-channel forming body.

* * * * *